United States Patent [19]

Fujiwara et al.

[11] Patent Number: 5,304,775
[45] Date of Patent: Apr. 19, 1994

[54] METHOD OF ETCHING A WAFER HAVING HIGH ANISOTROPY WITH A PLASMA GAS CONTAINING HALOGENS AND IN INERT ELEMENT

[75] Inventors: Nobuo Fujiwara; Kyusaku Nishioka; Teruo Shibano, all of Itami, Japan

[73] Assignee: Mitsubishi Denki Kabushiki Kaisha, Tokyo, Japan

[21] Appl. No.: 710,988

[22] Filed: Jun. 6, 1991

[51] Int. Cl.$^5$ .............................................. B23K 9/00
[52] U.S. Cl. ........................... 219/121.43; 219/121.41; 156/643; 156/646; 204/298.38
[58] Field of Search ....................... 219/121.43, 121.45; 204/298.17, 298.18, 298.37, 298.38; 156/345, 646; 427/38, 34

[56] References Cited

U.S. PATENT DOCUMENTS

| | | | |
|---|---|---|---|
| 4,877,509 | 10/1989 | Ogawa et al. | 204/298.37 |
| 4,996,077 | 2/1991 | Moslehi et al. | 427/38 |
| 5,007,374 | 4/1991 | Yamazaki et al. | 427/39 |
| 5,013,579 | 5/1991 | Yamazaki | 427/38 |
| 5,082,685 | 1/1992 | Morooka | 427/38 |
| 5,133,830 | 7/1992 | Asaka | 156/643 |

FOREIGN PATENT DOCUMENTS

| | | |
|---|---|---|
| 293879 | 6/1988 | European Pat. Off. |
| 4105103 | 8/1991 | Fed. Rep. of Germany . |

OTHER PUBLICATIONS

Fujiwara, Nobuo, ECR Plasma Etching with Heavy Halogen Ions, Japanese Journal of Applied Physics, vol. 29, No. 10, 1990.

Uetake, Hiroaki, et al, Anisotrophic etching of n+ polycrystalline silicon with high selectivity using a chlorine and nitrogen plasma in an ultraclean electron cyclotron resonance etcher, Appl. Phys. Lett. 57(6), Aug. 1990.

Patents Abstracts of Japan, Vapor Phase Etching Method, vol. 11/No. 29, Sep. 1987.

*Primary Examiner*—Mark H. Paschall
*Attorney, Agent, or Firm*—Sughrue, Mion, Zinn, Macpeak & Seas

[57] ABSTRACT

Fine processing is performed by using gas which contains halogen in such a manner that halogen ions contributing to an etching process and ions of a light element, the mass of which is smaller than that of the halogen ion and which does not react with a semiconductor wafer, are present in a plasma generated due to electron cyclotron resonance. Since energy in the plasma is in inverse proportion to the mass, the disorder motion of the halogen ions having large mass can be restrained. Therefore, the halogen ions can be made perpendicularly incident upon the surface of the semiconductor wafer. Consequently, etching process revealing high anisotropy can be performed.

25 Claims, 6 Drawing Sheets

ION ENERGY (eV)

METHOD OF ETCHING A WAFER HAVING HIGH ANISOTROPY WITH A PLASMA GAS CONTAINING HALOGENS AND IN INERT ELEMENT

BACKGROUND OF THE INVENTION

FIELD OF THE INVENTION

This invention relates to a fine processing method which can be preferably adapted to an electron cyclotron resonance dry etching apparatus (hereinafter called "ECR etching apparatus").

DESCRIPTION OF THE RELATED ART

FIG. 1 is a schematic structural view which illustrates an ECR etching apparatus. As shown in FIG. 1, a stage 3, on which a semiconductor wafer 2 is placed and held, is disposed in a cylindrical first reaction chamber 1. A second reaction chamber 4 is continuously formed from the upper portion of the first reaction chamber 1. A gas introduction pipe 5 is inserted into the second reaction chamber 4 so that reaction gas is introduced into the second reaction chamber 4 through the above-described gas introduction pipe 5. Furthermore, a quarts window 6a is formed in the upper portion of the second reaction chamber 4. In addition, a wave guide 6 is connected to the quartz window 6a. As a result, microwaves of a predetermined frequency can be introduced into the second reaction chamber 4 via the wave guide 6 and the quartz window 6a. A coil 7 is disposed around the second reaction chamber 4 so that a magnetic field of a predetermined flux density is created in a direction perpendicular to the surface of the semiconductor wafer 2 placed on the stage 3. Thus, high density gas plasma can be generated in the second reaction chamber 4 because the conditions necessary to generate the ECR (Electron Cyclotron Resonance) have been satisfied.

Furthermore, an exhaust port 8a is formed in the lower portion of the first reaction chamber 1. As a result, the first reaction chamber 1 is connected to a vacuum pump (omitted from the illustration) via an exhaust pipe 8 connected to the exhaust port 8a. Therefore, the first and the second reaction chambers 1 and 4 are evacuated, and as well as the vacuum level in the first and the second reaction chambers 1 and 4 can be maintained.

When the semiconductor wafer 2 is subjected to the etching process in the ECR etching apparatus thus-constituted, the first and the second reaction chambers 1 and 4 are first evacuated. Then, the pressure of the second reaction chamber 4 is set to a predetermined level by introducing the reaction gas into the second reaction chamber 4 by a predetermined flow rate while performing the evacuation. Furthermore, the magnetic field and the microwaves are applied to the inside portion of the second reaction chamber 4 so as to generate the gas plasma. The gas plasma thus-generated in the second reaction chamber 4 is introduced into the first reaction chamber 1 along the lines of the magnetic force. As a result, the semiconductor wafer 2 is subjected to the etching process with the plasma thus-introduced.

Then, the motion of the gas plasma, that is, the motion of the chloride ion Cl+ in the etching process performed as described above while employing, for example, chloride gas $Cl_2$ to be introduced as the reaction gas will now be considered. FIG. 6 is a schematic view which illustrates the above-described motion. Referring to FIG. 6, the chloride ions Cl+ are present in the plasma region 10 formed as described above. The magnitude of the vector designated by an arrow shows the magnitude of the kinetic energy possessed by the chloride ion Cl+, while the direction of the vector shows the moving direction of the chloride ion Cl+. As shown in FIG. 6, the chloride ion Cl+ has relatively large kinetic energy and thereby it acts disorderly.

Referring to FIG. 6, sheath electric field E is, as known, generated in a sheath region 11, the sheath electric field E being generated perpendicular to the surface of the semiconductor wafer 2. Therefore, when the chloride ion Cl+ reaches the above-describes sheath region 11, it is introduced into the sheath region 11 due to the affection of the sheath electric field E. As a result, the moving direction of the chloride ion Cl+ in the sheath region 1 is determined in accordance with the sum of the vector of the ion Cl+ and the vector of the sheath electric field E. Therefore, the chloride ions Cl+, the moving direction of each of which is substantially perpendicular to the surface of the semiconductor wafer 2 when they have been moved from the plasma region 10 to the sheath region 11, are made perpendicularly incident upon the semiconductor wafer 2. If the moving direction of the same is not perpendicular to the surface of the semiconductor wafer 2, the chloride ions Cl+ move substantially along the sheath electric field E as far as the magnitude of the sheath electric field E is sufficiently larger than the energy possessed by the chloride ion Cl+. As a result, etching revealing high anisotropy can be performed if only the chloride ions Cl+ capable of meeting the above-described conditions are used.

However, the proportion of the chloride ions Cl+ which are moving in substantially the same direction as the direction of the sheath electric field E is unsatisfactorily small because the chloride ions Cl+ move disorderly as described above. In addition, only a small portion of the chloride ions Cl+, which reach the surface of the semiconductor wafer 2, can be made perpendicularly incident upon the above-described surface because the energy possessed by the chloride ion Cl+ is considerably larger than the magnitude of the sheath electric field E. Therefore, etching with satisfactory anisotropy cannot be performed.

SUMMARY OF THE INVENTION

Accordingly, an object of the present invention is to provide a fine processing method capable of overcoming the above-described problems and performing etching revealing high anisotropy.

According to one aspect of the present invention, there is provided a fine processing method comprising the steps of: applying microwaves and a magnetic field to a reaction chamber while introducing gas, which contains halogen, into the reaction chamber which has been vacuum-evacuated, forming plasma of the gas by electron cyclotron resonance and subjecting a semiconductor wafer to an etching process with the plasma, the fine processing method being characterized: the gas which contains halogen is gas in which halogen ions, which contribute to the etching process, and ions of a light element the mass of each of which is smaller than that of each of the halogen ions and which do not react with the semiconductor wafer, are present in the plasma.

DESCRIPTION OF THE PREFERRED EMBODIMENT

Figure 1:
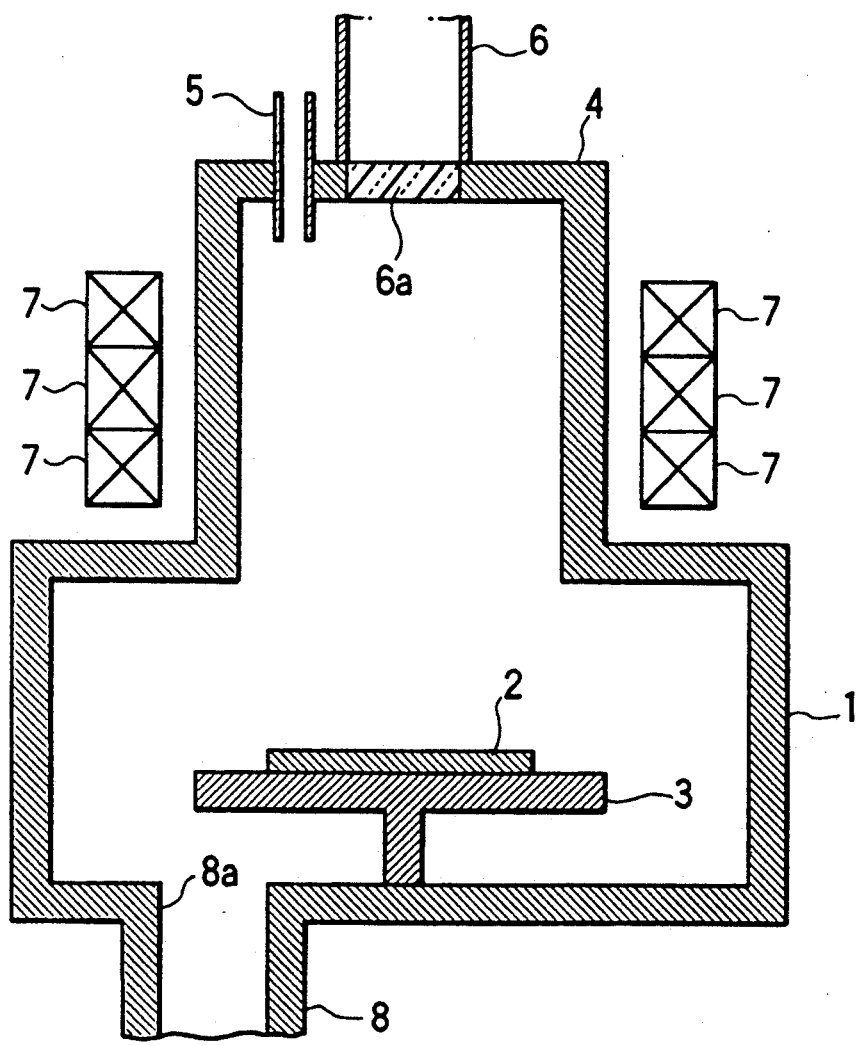
FIG. 1 is a schematic cross sectional view which illustrates an ECR etching apparatus.

A fine processing method according to the present invention can be employed in an ECR etching apparatus structured, for example, as shown in FIG. 1. Since the structure of the ECR etching apparatus has been already described, detailed description about it is omitted here. According to this embodiment, the employed gas contains halogen in such a manner that halogen ions contributing to an etching process and ions of a light element, the mass of which is smaller than that of the halogen ion and which does not react with a semiconductor wafer, are present in a plasma generated due to electron cyclotron resonance.

Then, the description will now be made about a case in which the gas which contains halogen is prepared in such a manner that chloride ($Cl_2$) gas is used as the supply source of the halogen ions and helium (He) gas is used as the supply source of the ions of the light element which does not react with the semiconductor wafer.

First, the first and the second reaction chambers 1 and 4 of the ECR etching apparatus are evacuated through the exhaust pipe 8. The $Cl_2$ gas and the He gas, which have been mixed with each other at a predetermined ratio, are introduced into the second reaction chamber 4 through the gas introduction pipe 5 while performing the evacuation so as to set the inside portion of each of the reaction chambers 1 and 4 to a predetermined pressure level.

Furthermore, a magnetic field and microwaves are applied to the inside portion of the reaction chamber 4 so that the gas plasma is generated.

As a result, the reaction chambers 1 and 4 are filled with the generated gas plasma. Furthermore, a sheath region 11 is formed adjacently to the surface of the semiconductor wafer 2 so that a sheath electric field, which is perpendicular to the surface of the semiconductor wafer 2, is generated.

Figure 2:
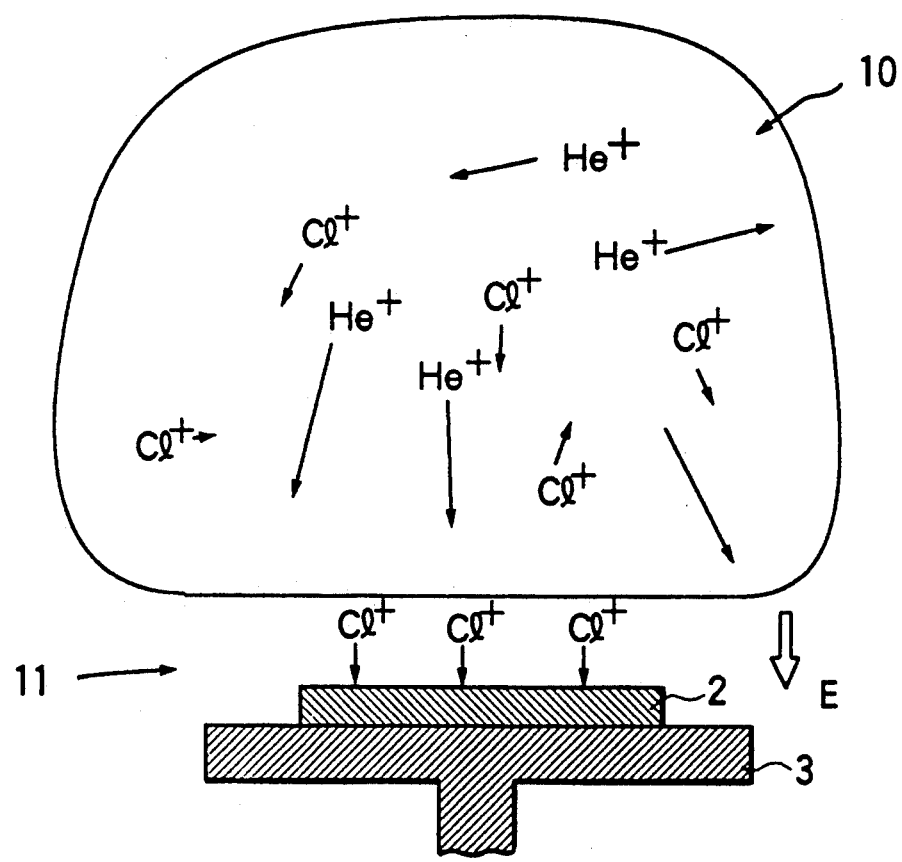
FIG. 2 is a schematic view which illustrates a plasma region in the ECR etching apparatus according to the present invention.

FIG. 2 schematically illustrates the movement of the gas plasma formed as described above. FIG. 2 also shows that the direction of vector denotes the moving direction of each ion and the size of the same denotes the magnitude of the energy (kinetic energy) possessed by each ion. As can be clearly seen from the result of a comparison made between FIGS. 2 and 6, the energy of chloride ion $Cl^+$ in the plasma region 10 according to this embodiment is considerably reduced in comparison to that according to the conventional structure.

Figure 6:
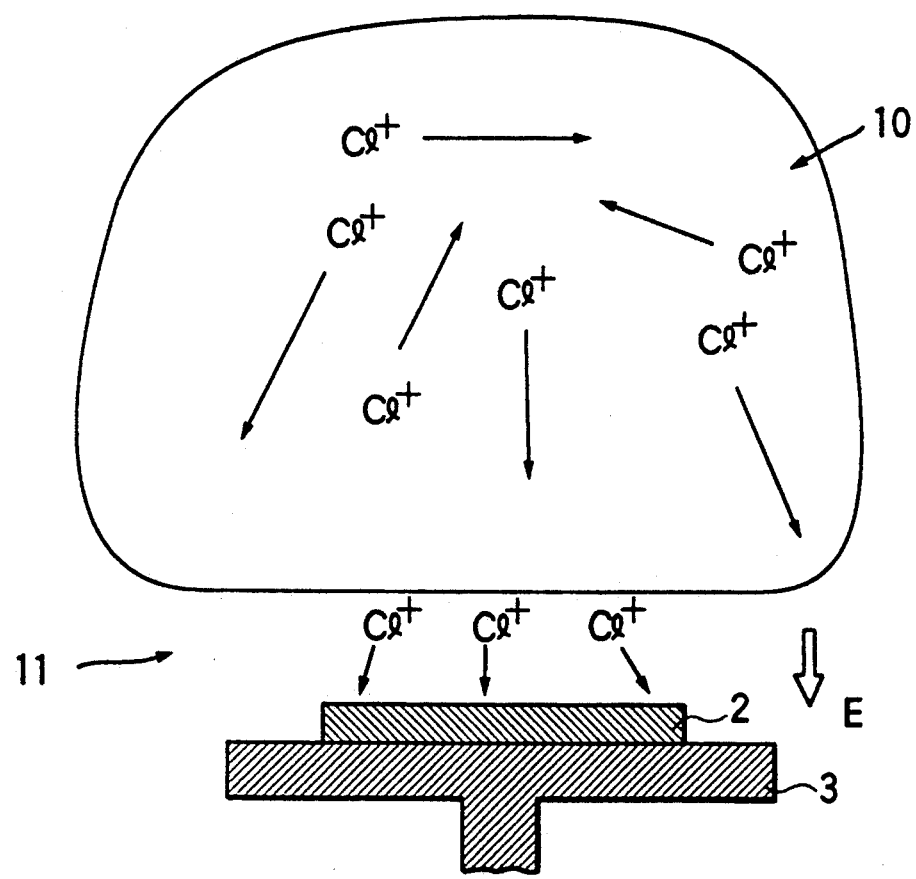
FIG. 6 is a schematic view which illustrates a plasma region in a conventional ECR etching apparatus.

The reason for this lies in that the energy of each of the ions is in proportion to the inverse number of its mass, that is, the ions having a large mass cannot easily move due to its inertia force in a case where a plurality of ions having different mass from each other are present in the plasma region. Therefore, in the above-described case where the chloride ion $Cl^+$ and the helium ion $He^+$ are present in the plasma region 10, the energy possessed by the helium ion He is relatively large and the same possessed by the chloride ion $Cl^+$ can be considerably reduced. That is, a portion of energy of the chloride ion $Cl^+$ is absorbed by the helium ion $He^+$ formed as described above, causing the energy of the chloride ion $Cl^+$ to be reduced in comparison to the conventional case (where only chloride ions $Cl^+$ are present in the plasma region 10 as shown in FIG. 6).

When the chloride ions $Cl^+$, the energy of each of which is reduced as described above, are introduced into the sheath region 11, the vector sum of the chloride ions $Cl^+$ and the sheath electric field E approaches the vector of the sheath electric field E even if the moving direction of the chloride ion $Cl^+$ does not coincide with that of the sheath electric field E. That is, the chloride ion $Cl^+$ is introduced into the surface of the semiconductor wafer 2 substantially along the sheath electric field E before it is substantially perpendicularly emitted to the semiconductor wafer 2. As a result, the semiconductor wafer 2 is subjected to etching with the chloride ion $Cl^+$ while possessing stronger anisotropy in comparison to the conventional structure.

Figure 3:
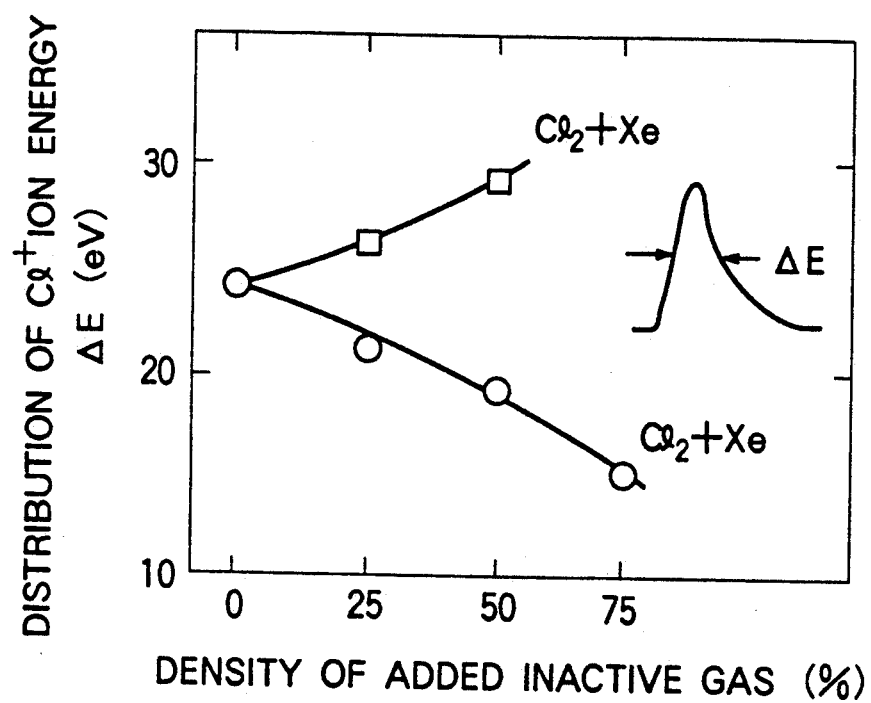
FIG. 3 is a graph which illustrates the relationship between the density of the added inactive gas and the energy of $Cl^+$ ion.

FIG. 3 is a graph which illustrates the degree of the energy distribution of the chloride ion $Cl^+$ in the plasma which has been created by subjecting the mixture gas prepared by mixing inactive gas into the chloride ion $Cl^+$ to the electron-cyclotron resonance.

Referring to FIG. 3, the degree of the energy distribution, that is, $\Delta E$ of FIG. 3 shows the magnitude of the disorder motion of the ions in the plasma.

As shown in FIG. 3, the energy distribution of the $Cl^+$ ions, that is, the disorder motion of the same is in inverse proportion to the density of mixed He in the case according to the present invention in which the mixture gas is composed of $Cl_2$ and He. On the contrary, in a case where Xe, which is heavier than the $Cl^+$ ion, is mixed, no effect cannot be obtained, resulting the increase in $\Delta E$ of the $Cl^+$ ion.

Figure 4:
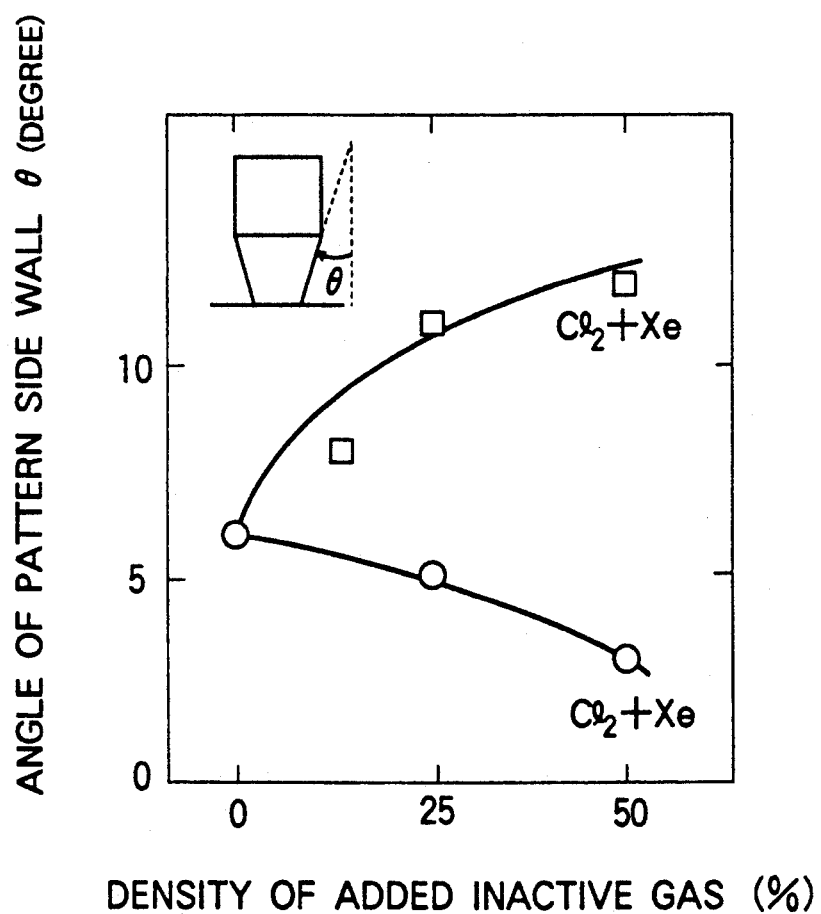
FIG. 4 is a graph which illustrates the relationship between the density of the added inactive gas and the angle of the side wall of the pattern.

FIG. 4 illustrates the relationship between the density of inactive gas and the angle of the side wall of the pattern in a case where polycrystal silicon is subjected to etching under the plasma conditions shown in FIG. 3.

In a case where the $He^+$ ions, the mass of each of which is smaller than that of $Cl^+$ ion, are present, the $Cl^+$ ions move along the sheath electric field because the disorder motion of each of the $Cl^+$ ions is small. As a result, the $Cl^+$ ions are perpendicularly made incident upon the semiconductor wafer. Therefore, the side wall of the pattern becomes perpendicular in accordance with the increase in the density of He, causing $\theta$ to be decreased. Consequently, etching can be performed while maintaining higher anisotropy.

On the contrary, in a case where Xe, which is heavier than the $Cl^+$ ion is mixed, $\theta$ is increased, causing the side wall of the pattern to be out of perpendicular.

According to the above-described embodiment, $Cl_2$ is selected as the supply source of the halogen ions and He is selected as the supply source of the ions of the light element. However, the supply source of the halogen ions may be selected from a group consisting of $F_2$, $Br_2$, $I_2$ and the like and the supply source of the ions of the light element may be selected from a group consisting of $H_2$, $N_2$, Ne, Ar, Kr and the like in such a manner that the selected sources are properly combined with each other. For example, a combination of $F_2$ gas and gas selected from a group consisting of $H_2$, He and $N_2$, a combination of $Cl_2$ gas and gas selected from a group consisting of $H_2$, He, $N_2$ and Ne, a combination of Br gas and gas selected from a group consisting of $H_2$, He, $N_2$, Ne and Ar or a combination of $I_2$ gas and gas selected from a group consisting of $H_2$, He, $N_2$, Ne, Ar and Kr may be employed. In these cases, the disorder motion of the halogen ions can be restrained because of the similar reason, causing etching to be performed while maintaining high anisotropy.

Although the inactive light element gas is, according to the above-described embodiment, added to the halogen gas, gas capable of generating the halogen ions and the ions of the inactive light element when it is dissociated in the plasma may be used.

Then, the description will be made about a case in which hydrogen halide gas having the above-described characteristic is used.

Figure 5:
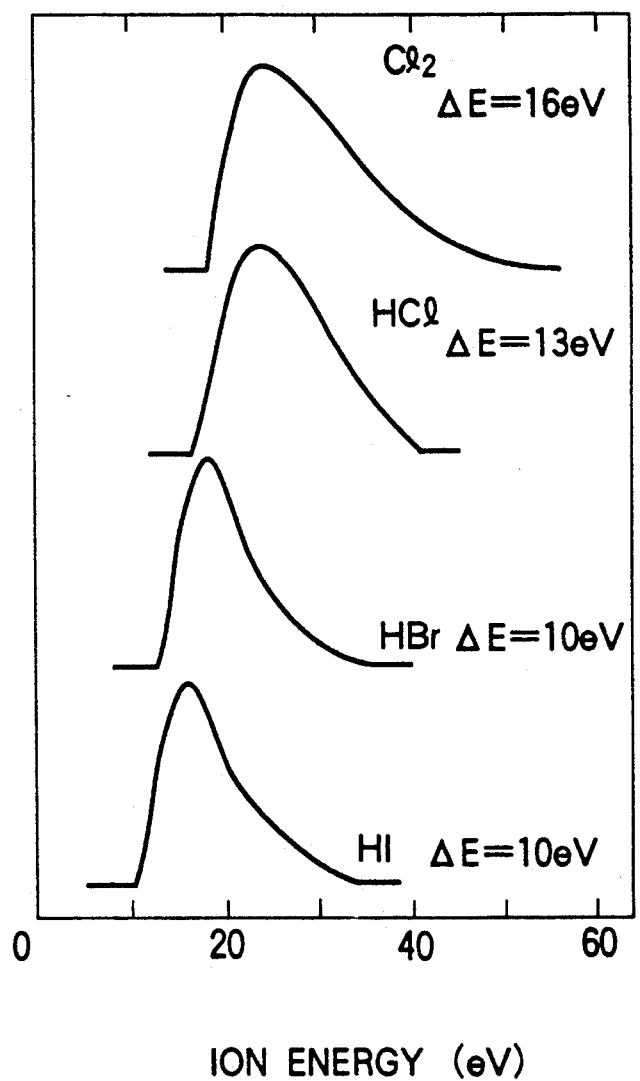
FIG. 5 is a graph which illustrates the energy distribution of the halogen ion.

FIG. 5 shows the results of measurement of the energy distribution of the halogen ions in $Cl_2$, HCl, Hbr and HI gases in a plasma generated under conditions of a pressure of 0.5 m Torr and the microwave electricity of 600 W.

In comparison to $Cl_2$ which is the halogen gas, the hydrogen halide gas, which generates, in the plasma, $H^+$ ions which are the ions of the light element, shows the reduced energy distribution range of $Cl^+$. Therefore, the disorder motion of the halogen ions is smaller than that of the halogen gas, causing etching to be performed while maintaining high anisotropy. Furthermore, since the $Br^+$ ions and I ions also show the reduced energy distribution range, etching to be performed while maintaining high anisotropy.

What is claimed is:

1. A method for performing etching upon a semiconductor wafer in a reaction chamber, comprising the steps of:
    applying microwaves and a magnetic field to said reaction chamber while injecting a reaction gas, which contains halogen, into said reaction chamber, forming a gas plasma of said reaction gas by electron cyclotron resonance and subjecting said semiconductor wafer to an etching process with said gas plasma, said method being characterized in that, prior to injection, said reaction gas is formed by mixing halogen ions, which contribute to said etching process, and ions of a light element, wherein a mass of each ion of said light element is smaller than a mass of each of said halogen ions and wherein said light element does not react with said semiconductor wafer.

2. A method as claimed in claim 1 wherein said reaction gas is a mixture of halogen gas a light element gas.

3. A method as claimed in claim 1 wherein said halogen gas is fluorine gas and said light element gas is one of a group consisting of hydrogen, helium and nitrogen.

4. A method as claimed in claim 2 wherein said halogen gas is chloride gas and said light element gas is one of a group consisting of hydrogen, helium, nitrogen and neon.

5. A method as claimed in claim 2 wherein said halogen gas is boromine gas and said light element gas is one of a group consisting of hydrogen, helium, neon and argon.

6. A method as claimed in claim 2 wherein said halogen gas is iodine gas and said light element gas is one of a group consisting of hydrogen, helium, nitrogen, neon, argon and krypton.

7. A method as claimed in claim 1 wherein said reaction gas is a gas mixture of halogen and a light element.

8. A method as claimed in claim 7 wherein said gas mixture is hydrogen halide gas.

9. A method as claimed in claim 8 wherein said hydrogen halide is one of a group consisting of HCl, HBr and HI.

10. A method according to claim 1, further comprising the step of:
    reducing, prior to injection, a kinetic energy of said halogen ions to a desired level, at which a direction of travel of said halogen ions when contacting said wafer is substantially parallel to a direction of said magnetic field, by mixing said halogen ions and ions of said light element at a predetermined ratio.

11. A method according to claim 1, further comprising the step of:
    prior to injecting said halogen ions into said reaction chamber, mixing said halogen ions with a different ion which reduces a kinetic energy of said halogen ions to a level sufficiently low that said halogen ions travel in a direction substantially parallel to a direction of said magnetic field.

12. A method according to claim 1, wherein said magnetic field is represented by a field vector, said method further comprising the step of:
    reducing, prior to injection, a kinetic energy of said halogen ions to a level, at which a vector sum of said field vector and a vector, representing said kinetic energy, has a direction substantially parallel to a direction of said field vector, by mixing said halogen ions and ions of said light element in a predetermined ratio.

13. A method according to claim 1, wherein said reducing step reduces the kinetic energy of said first ions at a surface of the wafer to a level sufficiently low that said first ions travel in a direction substantially parallel to a direction of said magnetic field.

14. A method according to claim 1, wherein said wafer is located in a first reaction chamber and said reaction gas is injected through a pipe in a second reaction chamber, wherein said first and second reaction chambers are filled with said reaction gas including said ions of said light element.

15. A method for performing etching upon a semiconductor wafer in a vacuum-evacuated reaction chamber, comprising the steps of:
    mixing first ions of a first element with second ions of a second element to form a reaction gas, said first ions being halogen ions,
    injecting said reaction gas into said reaction chamber,
    applying microwaves and a magnetic field to said reaction chamber, said magnetic field being represented by a field vector,
    reducing, during said mixing step, a kinetic energy of said first ions to a level, at which a vector sum of said field vector and a vector, representing said kinetic energy, has a direction substantially parallel to a direction of said field vector, by mixing said first and second ions in a predetermined ratio, forming a gas plasma from said reaction gas by electron cyclotron resonance in order to perform said etching process.

16. A method according to claim 15, wherein said wafer is located in a first reaction chamber and said reaction gas is injected through a pipe in a second reaction chamber, wherein said first and second reaction chambers are filled with said reaction gas including said second ions.

17. A method according to claim 15, wherein each of said second ions has a mass that is less than each of said first ions and wherein said second ions do not react with said semiconductor wafer.

18. A method as claimed in claim 15, wherein said step of injecting said reaction gas into said chamber occurs after said mixing and reducing steps for combining said first and second elements.

19. A method as claimed in claim 14, wherein said first element is fluorine gas and said second element gas is one of a group consisting of hydrogen, helium and nitrogen.

20. A method as claimed in claim 14, wherein said first element is chloride gas and said second element is one of a group consisting of hydrogen, helium, nitrogen and neon.

21. A method as claimed in claim 14, wherein said first element is bromine gas and said second element is one of a group consisting of hydrogen, helium, nitrogen, neon and argon.

22. A method as claimed in claim 14, wherein said first element is iodine gas and said second element is one of a group consisting of hydrogen, helium, nitrogen, neon, argon and krypton.

23. A method as claimed in claim 14, wherein said reaction gas is hydrogen halide gas.

24. A method as claimed in claim 23, wherein said hydrogen halide is one of a group consisting of HCL, HBr and HI.

25. A method according to claim 15, wherein said reducing step reduces the kinetic energy of said first ions at a surface of the wafer to a level sufficiently low that said first ions travel in a direction substantially parallel to a direction of said magnetic field.

* * * * *